(12) United States Patent
Nishi et al.

(10) Patent No.: US 8,048,817 B2
(45) Date of Patent: Nov. 1, 2011

(54) AMORPHOUS SILICA POWDER, PROCESS FOR ITS PRODUCTION, AND SEALING MATERIAL FOR SEMICONDUCTORS

(75) Inventors: Yasuhisa Nishi, Omuta (JP); Tohru Umezaki, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 382 days.

(21) Appl. No.: 12/517,851

(22) PCT Filed: Dec. 21, 2007

(86) PCT No.: PCT/JP2007/074727
§ 371 (c)(1), (2), (4) Date: Jun. 5, 2009

(87) PCT Pub. No.: WO2008/078706
PCT Pub. Date: Jul. 3, 2008

(65) Prior Publication Data
US 2011/0021666 A1    Jan. 27, 2011

(30) Foreign Application Priority Data
Dec. 22, 2006    (JP) .................................. 2006-346638

(51) Int. Cl.
*C03C 3/083*    (2006.01)
*C03C 3/06*    (2006.01)
*C08L 63/00*    (2006.01)
*B60C 1/00*    (2006.01)
*C04B 35/14*    (2006.01)
*C04B 35/00*    (2006.01)

(52) U.S. Cl. ............ 501/68; 501/54; 501/127; 501/128; 501/133; 501/153; 501/154; 523/443; 524/493

(58) Field of Classification Search ............ 501/54, 501/68, 133, 127, 128, 153, 154; 524/493; 523/443
See application file for complete search history.

(56) References Cited

U.S. PATENT DOCUMENTS

| | | | |
|---|---|---|---|
| 5,122,191 A * | 6/1992 | Morozumi et al. | 106/811 |
| 5,139,760 A * | 8/1992 | Ogawa et al. | 423/328.1 |
| 5,236,680 A * | 8/1993 | Nakazawa et al. | 423/328.1 |
| 5,298,234 A * | 3/1994 | Nakazawa et al. | 423/714 |
| 2003/0095905 A1* | 5/2003 | Scharfe et al. | 423/327.1 |
| 2003/0119650 A1* | 6/2003 | Sempolinski | 501/54 |
| 2003/0119651 A1* | 6/2003 | Sempolinski | 501/54 |
| 2005/0082062 A1* | 4/2005 | Webber et al. | 166/280.1 |
| 2007/0157524 A1 | 7/2007 | Lortz et al. | |
| 2009/0312477 A1* | 12/2009 | Nishi et al. | 524/444 |
| 2010/0041537 A1* | 2/2010 | Baran et al. | 501/33 |

FOREIGN PATENT DOCUMENTS

| | | |
|---|---|---|
| JP | 2 227451 | 9/1990 |
| JP | 10 152315 | 6/1998 |
| JP | 2000-230111 | 8/2000 |
| JP | 2004-35781 | 2/2004 |
| JP | 2005 306923 | 11/2005 |
| WO | 2005 097930 | 10/2005 |

* cited by examiner

Primary Examiner — Mark Eashoo
Assistant Examiner — Megan McCulley
(74) Attorney, Agent, or Firm — Oblon, Spivak, McClelland, Maier & Neustadt, L.L.P.

(57) ABSTRACT

To provide an amorphous silica powder suitable for a sealing material for semiconductors having improved HTSL properties and HTOL properties, and a process for its production.

An amorphous silica powder containing Al in an amount of from 0.03 to 20 mass % as calculated as $Al_2O_3$ measured by atomic absorption spectrophotometry, wherein the average particle size is at most 50 μm, and when the amorphous silica powder is divided according to the average particle size into two powders, a powder having a particle size smaller than the average particle size has a higher content as calculated as $Al_2O_3$ than a powder having a particle size larger than the average particle size.

20 Claims, No Drawings

AMORPHOUS SILICA POWDER, PROCESS FOR ITS PRODUCTION, AND SEALING MATERIAL FOR SEMICONDUCTORS

TECHNICAL FIELD

The present invention relates to an amorphous silica powder, a process for its production, and a sealing material for semiconductors using it.

BACKGROUND ART

To meet requirements of downsizing and weight saving and high functionality of electronic equipment, downsizing, reduction in thickness and reduction in pitch of semiconductor packages are rapidly in progress. Further, with respect to their mounting method, surface mounting suitable for high density mounting on a printed board or the like is dominant. As the semiconductor packages and their mounting methods are in progress, improvement in reliability of a sealing material for semiconductors in high temperature environment is more highly required.

Particularly for automobiles, mounting of controlling members and electronic equipment which heavily employ semiconductors is in progress. Accordingly, a sealing material for semiconductors is required to have flame retardancy imparted without using a flame retardant with a heavy environmental burden, to be resistant to mechanical external pressure such as vibration and acceleration, and to be guaranteed to operate in severe high temperature environment in the car. Thus, the sealing material is required to have high temperature storage life (hereinafter sometimes referred to as HTSL properties) and high temperature operating life (hereinafter sometimes referred to as HTOL properties) higher than those required for general equipment.

In order to meet such requirements, a means of improving high temperature life has been employed by reducing ionic impurities and electrically conductive impurities in a sealing material for semiconductors as far as possible, by incorporating an amorphous silica powder at a high density to reduce moisture absorptivity, by adding an ion trapping agent, or by employing a resin containing no flame retardant such as halogen, antimony or inorganic phosphorus (Patent Documents 1 and 2). However, by such a means, the effect of improving the high temperature life is still insufficient, and a sealing material for semiconductors which satisfies severe requirements of HTSL properties and HTOL properties has not yet been known.

Patent Document 1: JP-A-2000-230111
Patent Document 1: JP-A-2004-035781

DISCLOSURE OF THE INVENTION

Object to be Accomplished by the Invention

The object of the present invention is to provide an amorphous silica powder suitable for a sealing material for semiconductors having improved HTSL properties and HTOL properties, a process for its production, and a sealing material for semiconductors using the obtained amorphous silica powder.

Means to Accomplish the Object

Namely, the present invention provides the following.
(1) An amorphous silica powder containing Al in an amount of from 0.03 to 20 mass % as calculated as $Al_2O_3$ measured by the following atomic absorption spectrophotometry, wherein the average particle size is at most 50 μm, and when the amorphous silica powder is divided according to the average particle size into two powders, a powder having a particle size smaller than the average particle size has a higher content as calculated as $Al_2O_3$ than a powder having a particle size larger than the average particle size:

(atomic absorption spectrophotometry): 1 g of a sample is weighed on a platinum dish, 20 ml of special grade reagent hydrofluoric acid and 1 ml of special grade reagent perchloric acid are added, the platinum dish is left at rest in a sand bath heated at 300° C. for 15 minutes and then cooled to room temperature, pure water is added to prepare 25 ml of a solution, and the Al amount of the solution is quantitatively determined by using an atomic absorption photometer from an analytical curve.

(2) The amorphous silica powder according to the above (1), wherein the ratio of the content as calculated as $Al_2O_3$ of the powder having a particle size smaller than the average particle size to the powder having a particle size larger than the average particle size, is from 1.2 to 50.

(3) The amorphous silica powder according to the above (1) or (2), wherein of a part of or the entire particles constituting the powder having a particle size larger than the average particle size, the content as calculated as $Al_2O_3$ at a portion of from the particle surface to a depth of 1 μm, is at least 1.10 times the content as calculated as $Al_2O_3$ at a portion with a depth exceeding 1 μm.

(4) The amorphous silica powder according to any one of the above (1) to (3), wherein with respect to the particle size based on mass measured by a laser diffraction scattering type particle size distribution measuring instrument, the cumulative value up to 12 μm is from 35 to 60%, the cumulative value up to 24 μm is from 40 to 65%, and the cumulative value up to 64 μm is from 85 to 100%.

(5) A process for producing the amorphous silica powder as defined in any one of the above (1) to (4), which comprises grinding a blended powder obtained by blending 100 parts by mass of a silica powder having an average particle size of at most 300 μm and from 0.01 to 25 parts by mass of an Al source powder having an average particle size of at most 30 μm, to produce a powder mixture finer by at least 30% than the average particle size of the blended powder, and subjecting the powder mixture to flame treatment, followed by classification for particle size adjustment.

(6) The process for producing the amorphous silica powder according to the above (5), wherein the Al source powder is an aluminum oxide powder.

(7) A composition comprising the amorphous silica powder as defined in any one of the above (1) to (4) and at least one of a resin and a rubber.

(8) A sealing material for semiconductors, comprising the composition as defined in the above (7) wherein at least one of the resin and the rubber contains an epoxy resin, a curing agent for the epoxy resin, and a curing accelerator for the epoxy resin.

Effects of the Invention

According to the present invention, a resin composition or a rubber composition (hereinafter both will sometimes be referred to simply as a "composition") having improved HTSL properties and HTOL properties, particularly a sealing material for semiconductors is provided. Further, an amorphous silica powder suitable for preparation of such a composition is provided.

BEST MODE FOR CARRYING OUT THE INVENTION

The amorphous silica powder of the present invention has an Al content as calculated as $Al_2O_3$ (sometimes referred to as a content as calculated as $Al_2O_3$ in the present invention) measured by atomic absorption spectrophotometry of from 0.03 to 20 mass %. If the content as calculated as $Al_2O_3$ is less than 0.03 mass %, the amount of impurities in the sealing material for semiconductors to be trapped tends to be small, whereby the HTSL properties and the HTOL properties can not remarkably be improved. On the other hand, if the content as calculated as $Al_2O_3$ is higher than 20 mass %, the coefficient of thermal expansion of the amorphous silica powder tends to be high, whereby thermal properties of the sealing material for semiconductors such as soldering heat resistance and thermal shock resistance tend to be impaired. In addition, the surface of the amorphous silica particles will be covered with an $Al_2O_3$, whereby no Lewis acid sites will be formed on the particle surface, whereby impurities in the sealing material for semiconductor will not be trapped. The content as calculated as $Al_2O_3$ of the amorphous silica powder is preferably from 0.05 to 15 mass %, particularly preferably from 0.1 to 10 wt %.

As an atomic absorption photometer to carry out the atomic absorption spectrophotometry, for example, an atomic absorption photometer AA-969 manufactured by Japan Jarrell Ash may be mentioned. A standard solution to be used for preparation of an analytical curve may, for example, be an Al standard solution (concentration: 1,000 ppm) for atomic absorption manufactured by KANTO CHEMICAL CO., INC. As a frame for measurement, an acetylene/nitrous oxide frame is used, and the absorbance at a wavelength of 309.3 nm is measured for quantitative determination.

The Al component measured by the atomic absorption spectrophotometry is considered to have a chemical bond in the amorphous silica, for example, to be present as silica-alumina glass having a —O—Si—O—Al—O— structure or the like. The reason is that in the case of a mere mechanical mixture of an amorphous silica powder with an alumina powder or a mere alumina coating on the silica particle surface, the Al component is insoluble in an acid and can not be detected by the atomic absorption spectrophotometry.

Further, the amorphous silica powder of the present invention is characterized in that it has an average particle size of at most 50 μm and that when it is divided according to the average particle size into two powders, a powder having a particle size smaller than the average particle size has a higher content as calculated as $Al_2O_3$ than a powder having a particle size larger than the average particle size. In the present invention, a powder having a particle size equal to the average particle size is included in the powder having a particle size larger than the average particle size.

In the present invention, when the amorphous silica powder is divided according to the average particle size into particles having a particle size (diameter) larger than the average particle size and particles smaller than the average particle size, the powder having a particle size larger than the average particle size is the total amount of particles having the same particle size as the average particle size and particles larger than the average particle size, and the powder having a particle size smaller than the average particle size is the total amount of particles having a particle size smaller than the average particle size.

If the average particle size of the amorphous silica powder of the present invention exceeds 50 μm, the silica powder can not be incorporated at a high density in the composition, whereby the HTSL properties and the HTOL properties will not sufficiently be improved. The average particle size is preferably from 8 to 50 μm, particularly preferably from 8 to 40 μm. Further, when a powder having a smaller average particle size contains a larger amount of the Al component than a powder having a larger average particle size when the amorphous silica powder is divided according to the average particle size into two powders, the area of contact with impurities in the sealing material for semiconductors tends to be large, whereby the effect of trapping impurities will be very high.

In the present invention, the average particle size is a particle size (D50) at a cumulative value of the mass of 50% in the particle size based on the mass measured by a laser diffraction scattering type particle size distribution measuring instrument.

The reason of development of the above effect obtainable by the present invention is described as follows. Namely, in a semiconductor apparatus, a semiconductor chip and a lead frame are connected and conducted by means of a gold wire. Further, on the lead frame side, a gold wire and an aluminum pad are connected by means of heat and ultrasonic waves. On that occasion, an alloy called eutectic crystals or an intermetallic compound is formed between gold and aluminum. It is known that during storage and operation at high temperature, erosion, cracks or void occurs on the eutectic portion due to influence by impurities in the sealing material for semiconductors, which causes problems such as an increase in the connection resistance and failure in conduction.

However, when an Al component by means of a chemical bond i.e. an Al component in a content as calculated as $Al_2O_3$ of from 0.03 to 20 mass % measured by atomic absorption spectrophotometry is present in the amorphous silica particles, it will be Lewis acid sites with a strong position of Al due to the difference in the coordination number between Si and Al. The Lewis acid sites trap impurities in the sealing material for semiconductors which impair the HTSL properties and the HTOL properties, such as Na ions, K ions, halogen, inorganic phosphorus and organic phosphorus for detoxification, whereby it will be possible to prepare a sealing material for semiconductors having improved HTSL properties and HTOL properties.

The above fact is demonstrated by that an amorphous silica powder having a content as calculated as $Al_2O_3$ of 10 mass % measured by the atomic absorption spectrophotometry has an effect of trapping impurities in the sealing material for semiconductors about 20 times higher than that of a mere mechanical mixture of 90 mass % of an amorphous silica powder and 10 mass % of an alumina powder or an amorphous silica powder covered with 10 mass % of alumina.

The above effect of trapping impurities is accelerated when the amorphous silica powder of the present invention satisfies at least one of the following (1) to (3). (1) When the amorphous silica powder is divided according to the average particle size into two powders, the ratio (AS/AL) of the content as calculated as $Al_2O_3$ of a powder having a particle size smaller than the average particle size (AS) to the content as calculated as $Al_2O_3$ of a powder having a particle size larger than the average particle size (AL) is preferably from 1.2 to 50, more preferably from 1.4 to 20, particularly preferably from 1.6 to 10. (2) Of a part of (a part means 20 mass % or more, preferably 30 mass % or more) or the entire particles constituting the powder having a particle size larger than the average particle size, the content as calculated as $Al_2O_3$ at a portion of from the particle surface to a depth of 1 μm, is at least 1.10 times, preferably at least 1.20 times, particularly preferably at least 1.30 times, the content at a portion with a depth exceeding 1 μm. (3) With respect to the particle size based on mass measured by a laser diffraction scattering type particle size distribution measuring instrument, the cumulative value up to 12 μm is from 35 to 60%, preferably from 37 to 58%, the cumulative value up to 24 μm is from 40 to 65%, preferably from 42 to 63%, and the cumulative value up to 64 μm is from 85 to 100%, preferably from 87 to 98%.

When the amorphous silica powder is divided according to the average particle size into two powders and the ratio of the content as calculated as $Al_2O_3$ of a powder (S) having a smaller average particle size to a powder (L) having a larger average particle size is within the above range, the area of contact between impurities in the sealing material for semiconductors and the Lewis acid sites on the surface of the amorphous silica powder tends to be large, whereby the effect of trapping impurities will be very high. However, if the ratio is remarkably higher than 50 times, the deviation of the Al component content relative to the particle size tends to be too significant, whereby the effect of trapping impurities by the powder having a larger average particle size will hardly be obtained.

Further, when the amorphous silica powder is divided according to the average particle size into two powders and of a part of or the entire particles constituting the is powder (L) having a larger average particle size, the Al component content at a portion of from the particle surface to a depth of 1 μm is within the above range based on the content at a portion with a depth exceeding 1 μm, Al is present in a larger amount on the surface of the amorphous silica particles, whereby the chances of contact between the Lewis acid sites and impurities tend to increase, whereby the effect of trapping impurities is accelerated.

Further, when the amorphous silica powder of the present invention has the above particle size distribution, when the amorphous silica powder is incorporated in a composition, the viscosity of the composition can be remarkably reduced, and consequently, the packing fraction can further be increased. Thus, the HTSL properties and the HTOL properties will more remarkably be improved. Namely, in order to incorporate the amorphous silica powder in a composition while suppressing thickening of the resin, it is necessary that the particle size distribution of the amorphous silica powder is close to the close-packed structure. In order that particles penetrate into packed structure constituted by particles within a range of from 24 to 64 μm to further densify the packed structure, it is preferred that the amount of particles of from 12 to 24 μm is as small as possible and particles of 12 μm or smaller are contained in a large amount.

As the optimum ratio (based on mass) of particles in the amorphous silica powder of the present invention, the cumulative value up to 12 μm is from 35 to 60%, the cumulative value up to 24 μm is from 40 to 65%, and the cumulative value up to 64 μm is from 85 to 100%. By such a particle size constitution, a composition having more excellent moldability will be obtained since favorable low viscosity properties are maintained even with high density packing. It is most preferred that there are no particles of from 12 to 24 μm since they are unnecessary for the tight packing structure constituted by the above two groups of particles, and their content is preferably at most 20% (including 0%), particularly preferably at most 10% (including 0%) if any.

In the present invention, the position of presence and the content of Al of the powder (L) having a larger average particle size when the amorphous silica powder is divided according to the average particle size into two powders, are determined as follows. Namely, the amorphous silica particles are embedded in an epoxy resin and cut, and the cross section is measured by X-ray microanalyzer (EPMA) JXA-8200 manufactured by JEOL Ltd. The measurement conditions are such that the accelerating voltage is 15 kV, the applied current is 10 nA, the magnification is 2,000 times, the cumulative time is 100 msec, the pixel size is 0.2 μm□, and the number of pixels is 256×256 pixels, and PET is used for analyzing crystals by SiKα rays, and TAPH is used for AlKα rays. Optional 80 particles are photographed under the above conditions, to determine the Al content at a surface portion from the particle surface to 1 μm, and the Al content at a portion with a depth exceeding 1 μm from the particle surface.

In the present invention, the particle size distribution of the amorphous silica powder is determined based on the particle size measurement by laser diffraction scattering method. As a measuring instrument, for example, "CILAS granulometer model 920", tradename, manufactured by CILAS is used. Water and a sample are mixed, followed by dispersion treatment by an ultrasonic homogenizer at an output of 200 W for one minute, and then measurement is conducted. The particle size distribution is measured with the particle size channels of 0.3 μm, 1 μm, 1.5 μm, 2 μm, 3 μm, 4 μm, 6 μm, 8 μm, 12 μm, 16 μm, 24 μm, 32 μm, 48 μm, 64 μm, 96 μm, 128 μm and 196 μm.

In the present invention, the amorphous ratio is determined from the intensity ratio of a specific diffraction peak obtained by X-ray diffraction analysis using a powder X-ray diffraction apparatus (e.g. "Model Mini Flex", tradename, manufactured by RIGAKU) within a range of 2θ of from 26° to 27.5° of CuKα rays. In the case of a silica powder, a main peak is present at 26.7° with respect to crystalline silica, but no peak is present with respect to the amorphous silica. When amorphous silica and crystalline silica coexist, a peak height at 26.7° in accordance with the ratio of crystalline silica is obtained, and accordingly from the ratio of the X-ray intensity of a sample to the X-ray intensity of a crystalline silica standard sample, the ratio of crystalline silica (X-ray diffraction intensity of the sample/X-ray diffraction intensity of crystalline silica) is calculated to determine the amorphous ratio from the formula: amorphous ratio (%)=(1−ratio of crystalline silica)×100. The amorphous silica powder of the present invention has an amorphous ratio measured by the above method of preferably at least 95%.

The average sphericity of the amorphous silica powder of the present invention is preferably at least 0.85, particularly preferably from 0.87 to 1.00, whereby the viscosity of the composition will further decrease, and moldability will further improve. The average sphericity is determined as follows. An image of a particle photographed by e.g. a stereoscopic microscope (e.g. "Model SMZ-10", tradename, manufactured by Nikon Corporation) is brought in an image analyzer (e.g. "MacView", tradename, manufactured by MOUNTEC CO., LTD.), and the project area (A) and the perimeter (PM) of the particle are measured from the photograph. Where the area of a circle corresponding to the perimeter (PM) is (B), the roundness of the particle is A/B. Assuming a circle having the same perimeter as the perimeter (PM) of the sample, since $PM=2\pi r$ and $B=\pi r^2$, $B=\pi \times (PM/2\pi)^2$, and the roundness of each particle is such that roundness=A/B=A×4π/(PM)². In the present invention, roundnesses of 200 optional particles are determined, and the square of the average is regarded as the average sphericity.

Now, the process for producing the amorphous silica powder of the present invention will be described. In the present invention, a blended powder of 100 parts by mass of a silica powder having an average particle size of at most 300 μm and from 0.01 to 25 parts by mass of an Al source powder (e.g. an aluminum powder, an aluminum oxide powder or an aluminum hydroxide powder) containing aluminum as the constituent and having an average particle size of at most 30 μm, is used. If the average particle size of the silica powder exceeds 300 μm, the grinding and mixing with the Al source powder will not homogeneously be carried out in some cases. The average particle size of the silica powder is preferably at most 200 μm, more preferably at most 100 μm. On the other hand, if the average particle size of the Al source powder exceeds 30 μm, mixing with the silica powder will be inhomogeneous, and formation of the Lewis acid sites of the amorphous silica powder to be produced may be small. The average particle size of the Al source powder is preferably at most 15 μm, more preferably at most 10 μm.

If the ratio of the Al source powder blended is out of the range of from 0.01 to 25 parts by mass, it will be difficult to control the Al component of the amorphous silica powder to be from 0.03 to 20 mass % as calculated as $Al_2O_3$. The Al source powder is particularly preferably an aluminum oxide powder from the viewpoint of safety and handling in grinding and mixing.

In the present invention, the blended powder is ground and mixed to prepare a powder mixture finner by at least 30%, preferably by at least 50% than the average particle size of the blended powder. The powder mixture has shear force imparted and its mixed state is reinforced by mechanochemical reaction, and accordingly when the powder mixture is injected into a flame, the Al source powder supported on the silica powder surface is less likely to be released, whereby production of the amorphous silica powder of the present invention will be very easy. As the grinding and mixing apparatus, a ball mill, a vibrating mill, a bead mill or the like is used. As the form of the grinding and mixing, either dry method or wet method using a medium such as pure water or an organic solvent may be employed, but dry method is employed when emphasis is put on mass productivity.

As a method of treating the powder mixture with a flame, followed by classification as the case requires, for example, a furnace body equipped with a burner, to which a collecting apparatus is connected, is used. The furnace body may be either of an open type or a closed type, or either vertical or horizontal. The collecting apparatus is provided with at least one of a gravity settling chamber, a cyclone, a bag filter and an electric dust collector, and by changing the collecting conditions, an amorphous silica powder classified into the desired particle size can be collected. As examples, JP-A-11-57451 and JP-A-11-71107 may be mentioned.

Further, in the present invention, the particle size distribution and the average particle size of the amorphous silica powder can be increased or reduced e.g. by the particle size distribution of the powder mixture to be subjected to flame treatment or the classification conditions of the flame treated product. Further, the average sphericity and the content as calculated as $Al_2O_3$ can be increased or decreased, respectively by e.g. the amount of the powder mixture supplied to the flame and the flame temperature, and by the ratio of the Al source powder blended. Further, it is also possible to produce an amorphous silica powder having the average particle size, the amorphous ratio, the content as calculated as $Al_2O_3$ or the like further specified, by producing various amorphous silica powders differing in the particle size distribution, the average particle size, the content as calculated as $Al_2O_3$ or the like, and properly mixing two or more of them, followed by classification as the case requires. When the amorphous silica powder is divided according to the average particle size into two powders, for example, a vibrating sieve having a wire mesh with a predetermined aperture set may be used.

The composition of the present invention comprises the amorphous silica powder of the present invention incorporated in at least one of a resin and a rubber. The content of the amorphous silica powder in the composition is preferably from 10 to 99 mass %, particularly preferably from 15 to 90 mass %.

As the resin, an epoxy resin, a silicone resin, a phenol resin, a melamine resin, a urea resin, an unsaturated polyester, a fluororesin, a polyamide such as a polyimide, a polyamide-imide or a polyetherimide, a polyester such as polybutylene terephthalate or polyethylene terephthalate, a polyphenylene sulfide, an aromatic polyester, a polysulfone, a liquid crystal polymer, a polyether sulfone, a polycarbonate, a maleimide modified resin, an ABS resin, an AAS (acrylonitrile/acrylic rubber-styrene) resin, an AES (acrylonitrile/ethylene/propylene/diene rubber-styrene) resin or the like may be used.

Among them, as the sealing material for semiconductors, preferred is an epoxy resin having two or more epoxy groups in one molecule. Such an epoxy resin may, for example, be a phenol novolac epoxy resin, an o-cresol novolac epoxy resin, an epoxidized novolac resin of a phenol with an aldehyde, a glycidyl ether of e.g. bisphenol A, bisphenol F or bisphenol S, a glycidyl ester acid epoxy resin obtained by reaction of a polybasic acid such as phthalic acid or a dimer acid with epichlorohydrin, a linear aliphatic epoxy resin, an alicyclic epoxy resin, a heterocyclic epoxy resin, an alkyl-modified polyfunctional epoxy resin, a β-naphthol novolac epoxy resin, a 1,6-dihydroxynaphthalene epoxy resin, a 2,7-dihydroxynaphthalene epoxy resin, or a bishydroxybiphenyl epoxy resin, particularly an epoxy resin having halogen such as bromine introduced to impart flame retardancy, etc. Among them, in view of moisture resistance and resistance to solder reflow, preferred is an o-cresol novolac epoxy resin, a bishydroxybiphenyl epoxy resin, an epoxy resin having a naphthalene skeleton, or the like.

The curing agent for the epoxy resin may, for example, be a novolac resin obtained by reacting one or a mixture of two or more selected from the group consisting of phenol, cresol, xylenol, resorcinol, chlorophenol, t-butylphenol, nonylphenol, isopropylphenol, octylphenol and the like, with formaldehyde, paraformaldehyde or paraxylene in the presence of an oxidizing catalyst; a polyparahydroxy styrene resin; a bisphenol compound such as bisphenol A or bisphenol S; a trifunctional phenol such as pyrogallol or phloroglucinol; an acid anhydride such as maleic anhydride, phthalic anhydride or pyromellitic anhydride; or an aromatic amine such as metaphenylenediamine, diaminodiphenylmethane or diaminodiphenylsulfone. In order to accelerate the reaction of the epoxy resin with the curing agent, the above curing accelerator such as triphenylphosphine, benzyldimethylamine or 2-methylimidazol may be used.

To the composition of the present invention, the following component may further be blended as the case requires. Namely, as a stress-lowering agent, a rubber-like substance such as a silicone rubber, a polysulfide rubber, an acrylic rubber, a butadiene rubber, a styrene block copolymer or a saturated elastomer; a thermoplastic resin; a resin-like substance such as a silicone resin; or a resin having a part of or the entire phenol resin modified with e.g. an amino silicone, an epoxy silicone or an alkoxy silicone may, for example, be blended.

As a silane coupling agent, an epoxysilane such as γ-glycidoxypropyltrimethoxysilane or β-(3,4-epoxycyclohexyl) ethyltrimethoxysilane; an aminosilane such as aminopropyltriethoxysilane, ureidopropyltriethoxysilane or N-phenylaminopropyltrimethoxysilane; a hydrophobic silane compound such as phenyltrimethoxysilane, methyltrimethoxysilane or octadecyltrimethoxysilane or a mercaptosilane may, for example, be blended.

As a surface treating agent, Zr chelate, a titanate coupling agent or an aluminum coupling agent may, for example, be blended. As an auxiliary flame retardant, $Sb_2O_3$, $Sb_2O_4$ or $Sb_2O_5$ may, for example, be blended. As a flame retardant, a halogenated epoxy resin or a phosphorus compound may, for example, be blended, and as a coloring agent, carbon black, iron oxide, a dye or a pigment may, for example, be blended. Further, as a mold release agent, a natural wax, a synthetic wax, a metal salt of a linear fatty acid, an acid amide, an ester or a paraffin may, for example, be blended.

The composition of the present invention can be produced by blending predetermined amounts of the above respective materials by e.g. a blender or a Henschel mixer, kneading the blended product by e.g. a hot roll, a kneader, a single screw or twin screw extruder, and cooling and grinding the kneaded product.

The sealing material for semiconductors of the present invention comprises the composition of the present invention containing an epoxy resin, a curing agent for the epoxy resin and a curing accelerator for the epoxy resin. To seal a semiconductor using the sealing material for semiconductors of the present invention, a conventional molding means such as a transfer mold or a multiple plunger may be employed.

EXAMPLES

Now, the present invention will be described in further detail with reference to Examples and Comparative Examples. However, it should be understand that the present invention is by no means restricted to such specific Examples. In the present invention, the part(s) means part(s) by mass and % means mass %, unless otherwise specified.

Examples 1 to 5 and Comparative Examples 1 to 5

From 0 to 30 parts of an aluminum oxide powder having an average particle size of from 5.2 to 39 μm was blended with 100 parts of a silica powder having an average particle size of from 75 to 350 μm, and a powder mixture finner by from 21 to 95% than the average particle size of the original blended powder was produced by using a ball mill (Model 1000L-PBM, manufactured by ASADA IRON WORKS, CO., LTD.). The powder mixture was subjected to flame treatment as shown in the following (a) to (e) using an apparatus disclosed in JP-A-11-57451, followed by classification to produce various spherical amorphous silica powders.

Namely, ten spherical amorphous silica powder intermediates (i) to (x) as identified in Table 1 were produced by adjusting (a) the average particle size (75 to 350 μm) of the raw material powder, (b) the grinding and mixing conditions (a ball mill having silicon nitride balls of 20 mm in diameter packed in an amount of 30 vol % based on the mill volume, with a rotational number of from 10 to 120 rpm), (c) the amount of the powder mixture supplied to the flame (300 to 500 kg/hr), (d) flame formation conditions (60 to 80 m³/hr of LPG and 250 to 400 m³/hr of oxygen) and (e) classification conditions (cyclone inlet flow rate of 5 to 30 m/s). Further, these silica powder intermediates (i) to (x) were respectively blended as identified in Table 2 to produce amorphous silica powders (A) to (J).

The average particle size and the particle size distribution of the amorphous silica powder were adjusted by changing (f) the average particle size of the powder mixture to be subjected to flame treatment to make the powder spherical, and (g) the conditions of multi-stage sieving of the powder treated to make it spherical, and the mixing amount of coarse particles, medium particles and fine particles recovered by the sieving operation. Further, the Al concentration and the Al-distributed silica powder within a certain particle size range of the amorphous silica powder were controlled by changing (h) the particle size and the blend ratio of the aluminum oxide powder to be blended every particle size of the raw material powder. The average sphericity was controlled by adjusting (d) the flame formation conditions and (c) the amount of the powder mixture supplied to the flame.

All the obtained spherical amorphous silica powders A to J had an amorphous ratio of at least 99.5%, and had an average particle size and a content as calculated as $Al_2O_3$ as identified in Table 2.

Further, using a vibrating sieve having a wire mesh with an aperture at the same size as the average particle size of each of the spherical amorphous silica powders A to J, the silica powder was divided according to each average particle size into two powders i.e. a powder having a particle size larger than the average particle size and a powder having a particle size smaller than the average particle size. The content as calculated as $Al_2O_3$ of the former (AL) and the content as calculated as $Al_2O_3$ of the latter (AS), and AS/AL are shown in Table 2. Further, with respect to each sample of a powder having a particle size larger than the average particle size of each of the spherical amorphous silica powders A to J, the ratio of the content as calculated as $Al_2O_3$ at a portion of from the particle surface to a depth of 1 μm, to the content as calculated as $Al_2O_3$ at a portion with a depth exceeding 1 μm of particles having a particle size larger than the average particle size, was calculated from the intensity ratio of aluminum element measured by X-ray microanalyzer (EPMA) JXA-8200 manufactured by JEOL Ltd. and shown in Table 2.

Further, the particle size distribution of each of the spherical amorphous silica powders A to J was measured to determine the average particle size, the cumulative value up to 12 μm, the cumulative value up to 24 μm and the cumulative value up to 64 μm. Further, the $Al_2O_3$ content and the average sphericity were obtained. The cumulative value up to 12 μm, the cumulative value up to 24 μm and the cumulative value up to 64 μm respectively as C1, C2 and C3 are shown in Table 2.

To evaluate properties of the spherical amorphous silica powders as a sealing material for semiconductors, to 86 parts of each of the spherical amorphous silica powders A to J, 4.5 parts of a 4,4'-bis(2,3-epoxypropoxy)-3,3',5,5'-tetramethylbiphenyl epoxy resin, 4.0 parts of a phenol resin, 0.2 part of triphenylphosphine, 0.5 part of phenylaminosilane, 0.3 part of carbon black and 0.5 part of carnauba wax were added, followed by dry blending by a Henschel mixer, and then the blended product was heat kneaded by a parallel matching twin screw extruder (screw diameter D: 25 mm, kneading disk length: 10 Dmm, number of revolution of paddle: 80 to 120 rpm, discharge amount: 3.0 kg/h, and temperature of the kneaded product: 99 to 101° C.). The kneaded product (discharged product) was cooled by a cooling pressing machine and then ground to produce a sealing material for semiconductors, and the HTSL properties, HTOL properties and the moldability (spiral flow) were evaluated as follows. The results are shown in Table 2.

(1) HTSL Properties

Using a transfer molding machine, a TEG-ML1020 chip was mounted on SOP-28p (made of lead frame 42 alloy), and the lead frame and the chip were connected with respect to 8 points by a gold wire of 40 μm in diameter, followed by packaging by the sealing material for semiconductors, and the package was after-cured at 175° C. for 8 hours to prepare 20 simulation semiconductors. These simulation semiconductors were stored at 195° C. for 1,500 hours and then cooled to room temperature, and then presence or absence of power distribution was measured. The number of the simulation semiconductors with failure in power distribution in at least one wiring among 8 wirings was counted.

(2) HTOL Properties

20 Simulation semiconductors were prepared in the same manner as for evaluation of the HTSL properties, and a direct current of 0.5 A was applied while they were stored at 195° C. for 100 hours. The number of the simulation semiconductors of which the electric resistance among wirings increased by 30% than the initial value was measured.

(3) Spiral Flow

Using a transfer molding machine having a mold for measuring spiral flow attached thereto in accordance with EMMI-I-66 (epoxy molding material institute, society of plastic industry), the spiral flow value of the sealing material for semiconductors was measured. The transfer molding conditions were such that the mold temperature: 175° C., the molding pressure: 7.4 MPa and the holding time: 90 seconds.

TABLE 1

| | Amorphous silica powder intermediate | | | | | | | | | |
|---|---|---|---|---|---|---|---|---|---|---|
| | i | ii | iii | iv | v | vi | vii | viii | ix | x |
| Average particle size (μm) of raw material silica powder | 108 | 108 | 108 | 212 | 108 | 75 | 350 | 108 | 108 | 108 |
| Type of Al source powder | | | | | Aluminum oxide | | | | | — |
| Average particle size (μm) of Al source powder | 5.2 | 5.2 | 5.2 | 16 | 16 | 5.2 | 5.2 | 39 | 5.2 | — |
| Blend ratio of Al source powder (part by mass per 100 parts by mass of silica powder) | 1 | 5 | 11 | 0.5 | 5 | 0.5 | 11 | 1 | 42 | 0 |
| Average particle size A (μm) of blended powder | 107 | 103 | 98 | 211 | 103 | 75 | 316 | 107 | 78 | 108 |
| Average particle size B (μm) of powder mixture after blended powder was ground and mixed | 4.9 | 4.7 | 28 | 49 | 42 | 59 | 25 | 8.8 | 24 | 19 |
| Rate of change of average particle size {1 − (B/A)} × 100 (%) | 95 | 95 | 71 | 76 | 59 | 21 | 92 | 91 | 69 | 82 |
| Conditions of flame treatment LPG (m³/hr) | 60 | 60 | 70 | 80 | 80 | 80 | 80 | 60 | 70 | 60 |
| Oxygen (m³/hr) | 250 | 250 | 320 | 400 | 400 | 400 | 400 | 250 | 320 | 250 |
| Amount of supply of powder mixture (kg/hr) | 300 | 300 | 400 | 500 | 500 | 500 | 500 | 300 | 400 | 300 |
| Cyclone inlet air flow rate (m/s) | 30 | 30 | 21 | 5 | 5 | 5 | 21 | 30 | 21 | 30 |
| Average particle size (μm) of amorphous silica powder immediately after flame treatment and sieving operation | 4.8 | 4.9 | 28 | 51 | 40 | 58 | 22 | 8.0 | 23 | 18 |

TABLE 2

| | | Ex. 1 | Ex. 2 | Ex. 3 | Ex. 4 | Ex. 5 |
|---|---|---|---|---|---|---|
| Ratio (mass %) of amorphous silica powder intermediate blended | i | 65 | 0 | 0 | 10 | 30 |
| | ii | 0 | 40 | 60 | 15 | 0 |
| | iii | 0 | 0 | 0 | 75 | 0 |
| | iv | 35 | 60 | 0 | 0 | 40 |
| | v | 0 | 0 | 40 | 0 | 20 |
| | vi | 0 | 0 | 0 | 0 | 0 |
| | vii | 0 | 0 | 0 | 0 | 0 |
| | viii | 0 | 0 | 0 | 0 | 0 |
| | ix | 0 | 0 | 0 | 0 | 0 |
| | x | 0 | 0 | 0 | 0 | 0 |
| Amorphous silica powder | | A | B | C | D | E |
| average particle size (μm) | | 21 | 34 | 17 | 23 | 29 |
| Content as calculated as $Al_2O_3$ (mass %) | | 0.9 | 2 | 5 | 8 | 2 |
| AL (mass %) | | 0.6 | 0.4 | 3.8 | 7.1 | 1.8 |
| AS (mass %) | | 1.1 | 4.8 | 6.7 | 8.6 | 2.2 |
| AS/AL (—) | | 1.8 | 12 | 1.8 | 1.2 | 1.2 |
| Al content at a portion less than 1 μm from particle surface/Al content at a portion exceeding 1 μm | | 1.23 | 1.35 | 1.24 | 1.41 | 1.19 |
| Cumulative weight | Cumulative value up to 12 μm C1 (%) | 43 | 39 | 45 | 41 | 36 |
| | Cumulative value up to 24 μm C2 (%) | 64 | 44 | 58 | 49 | 44 |
| | Cumulative value up to 64 μm C3 (%) | 98 | 87 | 95 | 92 | 88 |
| Average sphericity (—) | | 0.93 | 0.91 | 0.92 | 0.91 | 0.92 |
| High temperature storage life HTSL/failure in power distribution (number) | | 0/20 | 0/20 | 0/20 | 0/20 | 1/20 |
| High temperature operating life HTOL/increase of resistance by 30% or more (number) | | 0/20 | 0/20 | 1/20 | 0/20 | 2/20 |
| Moldability/spiral flow (cm) | | 110 | 123 | 116 | 137 | 131 |

TABLE 2-continued

|  |  | Comp. Ex. 1 | Comp. Ex. 2 | Comp. Ex. 3 | Comp. Ex. 4 | Comp. Ex. 5 |
|---|---|---|---|---|---|---|
| Ratio (mass %) of amorphous silica powder intermediate blended | i | 0 | 0 | 0 | 0 | 0 |
|  | ii | 0 | 0 | 0 | 0 | 0 |
|  | iii | 0 | 20 | 0 | 0 | 0 |
|  | iv | 0 | 0 | 0 | 0 | 0 |
|  | v | 0 | 0 | 0 | 0 | 0 |
|  | vi | 0 | 80 | 8 | 0 | 0 |
|  | vii | 10 | 0 | 0 | 0 | 0 |
|  | viii | 90 | 0 | 0 | 0 | 0 |
|  | ix | 0 | 0 | 0 | 100 | 0 |
|  | x | 0 | 0 | 92 | 0 | 100 |
| Amorphous silica powder |  | F | G | H | I | J |
| average particle size (μm) |  | 9 | 52 | 21 | 23 | 18 |
| Content as calculated as $Al_2O_3$ (mass %) |  | 2 | 2 | 0.02 | 26 | 0 |
| AL (mass %) |  | 11 | 0.2 | 0.2 | 17 | — |
| AS (mass %) |  | 1 | 11 | 0.01 | 35 | — |
| AS/AL (—) |  | 0.1 | 55 | 0.05 | 2.0 | — |
| Al content at a portion less than 1 μm from particle surface/Al content at a portion exceeding 1 μm |  | 1.20 | 1.46 | 1.34 | 1.02 | — |
| Cumulative weight | Cumulative value up to 12 μm C1 (%) | 70 | 18 | 19 | 37 | 43 |
|  | Cumulative value up to 24 μm C2 (%) | 93 | 32 | 42 | 49 | 55 |
|  | Cumulative value up to 64 μm C3 (%) | 100 | 78 | 91 | 92 | 94 |
| Average sphericity (—) |  | 0.90 | 0.86 | 0.88 | 0.93 | 0.89 |
| High temperature storage life HTSL/failure in power distribution (number) |  | 2/20 | 7/20 | 8/20 | 4/20 | 11/20 |
| High temperature operating life HTOL/increase of resistance by 30% or more (number) |  | 5/20 | 7/20 | 15/20 | 7/20 | 20/20 |
| Moldability/spiral flow (cm) |  | 52 | 61 | 82 | 93 | 74 |

As evident from comparison between Examples and Comparative Examples, according to the amorphous silica powders in Examples of the present invention, it is possible to prepare a composition excellent in HTSL properties and HTOL properties as compared with Comparative Examples, particularly a sealing material for semiconductors.

INDUSTRIAL APPLICABILITY

The amorphous silica powder of the present invention is used for a sealing material for semiconductors to be used for automobiles, portable electronic equipment, personal computers, home electric appliances, etc., a laminated plate on which a semiconductor is to be mounted, or a filler for putty, a sealing material, a rubber, an engineering plastic, etc.

Further, the composition containing the amorphous silica powder of the present invention is used as a sealing material for semiconductors and in addition, prepreg for a printed board, an engineering plastic, etc., which is obtained by impregnating glass woven fabric, glass non-woven fabric or another organic substrate, followed by curing.

The entire disclosure of Japanese Patent Application No. 2006-346638 filed on Dec. 22, 2006 including specification, claims and summary is incorporated herein by reference in its entirety.

The invention claimed is:

1. An amorphous silica powder containing Al in an amount of from 0.03 to 20 mass % as calculated as $Al_2O_3$ measured by the following atomic absorption spectrophotometry, wherein the average particle size is at most 50 μm, and when the amorphous silica powder is divided according to the average particle size into two powders, a powder having a particle size smaller than the average particle size has a higher content as calculated as $Al_2O_3$ than a powder having a particle size larger than the average particle size:

atomic absorption spectrophotometry: 1 g of a sample is weighed on a platinum dish, 20 ml of special grade reagent hydrofluoric acid and 1 ml of special grade reagent perchloric acid are added, the platinum dish is left at rest in a sand bath heated at 300° C. for 15 minutes and then cooled to room temperature, pure water is added to prepare 25 ml of a solution, and the Al amount of the solution is quantitatively determined by using an atomic absorption photometer from an analytical curve.

2. The amorphous silica powder according to claim 1, wherein the ratio of the content as calculated as $Al_2O_3$ of the powder having a particle size smaller than the average particle size to the powder having a particle size larger than the average particle size, is from 1.2 to 50.

3. The amorphous silica powder according to claim 2, wherein of a part of or the entire particles constituting the powder having a particle size larger than the average particle size, the content as calculated as $Al_2O_3$ at a portion of from the particle surface to a depth of 1 μm, is at least 1.10 times the content as calculated as $Al_2O_3$ at a portion with a depth exceeding 1 μm.

4. The amorphous silica powder according to claim 3, wherein with respect to the particle size based on mass measured by a laser diffraction scattering type particle size distribution measuring instrument, the cumulative value up to 12 μm is from 35 to 60%, the cumulative value up to 24 μm is from 40 to 65%, and the cumulative value up to 64 μm is from 85 to 100%.

5. A composition comprising the amorphous silica powder as defined in claim 3 and at least one of a resin and a rubber.

6. A sealing material for semiconductors, comprising the composition as defined in claim 5 wherein at least one of the resin and the rubber contains an epoxy resin, a curing agent for the epoxy resin, and a curing accelerator for the epoxy resin.

7. The amorphous silica powder according to claim 2, wherein with respect to the particle size based on mass measured by a laser diffraction scattering type particle size distribution measuring instrument, the cumulative value up to 12 μm is from 35 to 60%, the cumulative value up to 24 μm is from 40 to 65%, and the cumulative value up to 64 μm is from 85 to 100%.

8. A process for producing the amorphous silica powder as defined in claim 2, which comprises grinding a blended powder obtained by blending 100 parts by mass of a silica powder having an average particle size of at most 300 μm and from 0.01 to 25 parts by mass of an Al source powder having an average particle size of at most 30 μm, to produce a powder mixture finer by at least 30% than the average particle size of the blended powder, and subjecting the powder mixture to flame treatment, followed by classification for particle size adjustment.

9. The process for producing the amorphous silica powder according to claim 8, wherein the Al source powder is an aluminum oxide powder.

10. A composition comprising the amorphous silica powder as defined in claim 2 and at least one of a resin and a rubber.

11. A sealing material for semiconductors, comprising the composition as defined in claim 10 wherein at least one of the resin and the rubber contains an epoxy resin, a curing agent for the epoxy resin, and a curing accelerator for the epoxy resin.

12. The amorphous silica powder according to claim 1, wherein of a part of or the entire particles constituting the powder having a particle size larger than the average particle size, the content as calculated as $Al_2O_3$ at a portion of from the particle surface to a depth of 1 μm, is at least 1.10 times the content as calculated as $Al_2O_3$ at a portion with a depth exceeding 1 μM.

13. The amorphous silica powder according to claim 12, wherein with respect to the particle size based on mass measured by a laser diffraction scattering type particle size distribution measuring instrument, the cumulative value up to 12 μm is from 35 to 60%, the cumulative value up to 24 μm is from 40 to 65%, and the cumulative value up to 64 μm is from 85 to 100%.

14. A composition comprising the amorphous silica powder as defined in claim 12 and at least one of a resin and a rubber.

15. A sealing material for semiconductors, comprising the composition as defined in claim 14 wherein at least one of the resin and the rubber contains an epoxy resin, a curing agent for the epoxy resin, and a curing accelerator for the epoxy resin.

16. The amorphous silica powder according to claim 1, wherein with respect to the particle size based on mass measured by a laser diffraction scattering type particle size distribution measuring instrument, the cumulative value up to 12 μm is from 35 to 60%, the cumulative value up to 24 μm is from 40 to 65%, and the cumulative value up to 64 μm is from 85 to 100%.

17. A process for producing the amorphous silica powder as defined in claim 1, which comprises grinding a blended powder obtained by blending 100 parts by mass of a silica powder having an average particle size of at most 300 μm and from 0.01 to 25 parts by mass of an Al source powder having an average particle size of at most 30 μm, to produce a powder mixture finer by at least 30% than the average particle size of the blended powder, and subjecting the powder mixture to flame treatment, followed by classification for particle size adjustment.

18. The process for producing the amorphous silica powder according to claim 17, wherein the Al source powder is an aluminum oxide powder.

19. A composition comprising the amorphous silica powder as defined in claim 1 and at least one of a resin and a rubber.

20. A sealing material for semiconductors, comprising the composition as defined in claim 19 wherein at least one of the resin and the rubber contains an epoxy resin, a curing agent for the epoxy resin, and a curing accelerator for the epoxy resin.

* * * * *